United States Patent [19]

Brewer

[11] 4,193,128
[45] Mar. 11, 1980

[54] HIGH-DENSITY MEMORY WITH NON-VOLATILE STORAGE ARRAY

[75] Inventor: Joe E. Brewer, Severna Park, Md.

[73] Assignee: Westinghouse Electric Corp., Pittsburgh, Pa.

[21] Appl. No.: 911,266

[22] Filed: May 31, 1978

[51] Int. Cl.$^2$ ............................................. G11C 11/40
[52] U.S. Cl. ..................................... 365/228; 365/184; 365/205; 307/238; 357/23
[58] Field of Search ............... 365/154, 182, 183, 184, 365/205, 228; 357/23; 307/238, 279

[56] References Cited

U.S. PATENT DOCUMENTS

| | | | |
|---|---|---|---|
| 3,651,492 | 3/1972 | Lockwood | 340/173 LI |
| 3,676,717 | 7/1972 | Lockwood | 340/173 LI |
| 3,683,335 | 8/1972 | Cricchi et al. | 365/228 |
| 3,831,155 | 8/1974 | Tamaru et al. | 365/228 |
| 3,836,894 | 9/1974 | Cricchi et al. | 365/228 |
| 3,845,327 | 10/1974 | Cricchi et al. | 365/228 |
| 3,881,180 | 4/1975 | Gosney et al. | 365/189 |
| 3,887,055 | 4/1975 | Fisher et al. | 357/23 |
| 3,889,287 | 6/1975 | Powell | 357/23 |
| 3,908,182 | 9/1975 | Lampe et al. | 365/228 |
| 3,911,464 | 10/1975 | Chany et al. | 365/228 |
| 4,064,492 | 12/1977 | Schurmeyer et al. | 365/228 |
| 4,070,655 | 1/1978 | Schurmeyer et al. | 365/228 |

Primary Examiner—Terrell W. Fears
Attorney, Agent, or Firm—H. W. Patterson

[57] ABSTRACT

A memory sub-array having a single volatile memory cell and an array of nonvolatile memory cells. The volatile memory cell includes a static flip-flop circuit and each memory cell of the nonvolatile memory cell array includes a pair of nonvolatile memory transistors that store information in accordance with the state of the transistor threshold voltage.

8 Claims, 3 Drawing Figures

HIGH-DENSITY MEMORY WITH NON-VOLATILE STORAGE ARRAY

BACKGROUND OF THE INVENTION

1. Field of the Invention

The present invention relates to memory devices and methods for storing information. More particularly, the invention relates to high density memory devices having non-volatile storage capability and methods for the high-density storage of information in non-volatile condition.

2. Description of the Prior Art

In the electrical art, devices for storing information can be generally classified as providing "volatile" or "non-volatile" storage of information. As known in the art and as used herein "volatile storage" is specifically defined to mean that the stored information will be lost in the absence of power supply voltages, whereas "non-volatile storage" is defined to mean that the information is retained in the absence of power supply voltages.

In the prior art, it was recognized that devices capable of non-volatile information storage offered considerable advantages in reliability because, in the event of a power failure, information stored therein would not be lost and use of the devices could be resumed without first regenerating the information. In earlier prior art, magnetic cores were typically employed as memory elements that stored binary information through control of magnetic flux changes in the core. However, the physical size and power requirements of such magnetic cores presented limitations and disadvantages as to their use.

Subsequently, electronic devices were developed that were capable of storing binary information in non-volatile condition. Of chief importance among these electronic devices are insulated-gate-field-effect-transistors (IGFET's) and, more particularly, metal-nitride-oxide-silicon (MNOS) transistors. MNOS transistors have been found to exhibit characteristic changes of threshold voltage in response to relatively high gate-to-source voltages ($V_{GS}$), such that binary information can be stored in MNOS transistors by shifting the level of the threshold voltage. Specifically, it has been found that, when the oxide layer of a MNOS transistor is made very thin (as, for example, about 20 Å), it is possible to selectively insert or remove electrical charge from traps in the nitride close to the nitride-oxide interface by applying a voltage across the gate insulator. The charge trapped in the insulator alters the threshold voltage of the transistor such that the threshold voltage is selectively shifted or switched by the application of the voltage across the gate insulator. The most positive threshold level places the transistor in a high conduction (HC) state, generally described by the symbol $V_{HC}$, and the most negative threshold places the transistor in a low conduction (LC) state, generally described by the symbol $V_{LC}$. When powers is removed from the transistor, the trapped charge remains in the composite insulator for long time periods such that the storage of information in accordance with the transistor threshold level is characterized as non-volatile. Storage of binary information in this manner is somewhat analogous to the storage of such information in magnetic cores but with the advantages that these devices require relatively little power, are extremely small, and easy to fabricate. Examples of such devices are shown and described in U.S. Pat. No. 3,683,335 to Cricchi et al., U.S. Pat. No. 3,889,287 to M. W. Powell; U.S. Pat. No. 3,845,327 to J. R. Cricchi; U.S. Pat. No. 3,836,894 to J. R. Cricchi; U.S. Pat. (Ser. No. 219,463) filed Jan. 20, 1972 to J. R. Cricchi; U.S. Pat. No. 3,908,182 to Lampe et al.; U.S. Pat. No. 3,877,055 to J. A. Fisher et al.; and U.S. Pat. No. 3,881,180 to W. M. Goshey, Jr.

A problem in the prior art has been that electronic devices that have been used as memory elements have been found to be subject to fatigue and tend to change their characteristics and parameters with use. For example, an MNOS memory transistor which does not incorporate any stress protection features can be expected to exhibit significant changes in pulse response and in threshold voltage decay rate after having been erased and written about $10^6$ times.

Accordingly, devices and methods have been developed whereby the life expectancy for non-volatile electronic memory devices would be improved. Some of these developments, such as U.S. Pat. No. 3,911,464 to Chang et al., were directed to modifications of the basic device. Other developments were directed to combining the non-volatile memory devices with other electronic devices which, although having only volatile storage capability, could perform many more storage operations.

As used herein, the term "memory cell" is defined to mean the circuitry required to store one binary bit of information, and the term "composite memory cell" is defined to mean a memory cell that includes a combination of non-volatile and volatile memory cells. Composite memory cells were intended to produce a memory cell that had both non-volatile storage capability and a long life expectancy. Examples of such composite cells are shown in U.S. Pat. No. 4,070,655 to F. L. Schurmeyer et. al.; U.S. Pat. No. 4,064,492 to F. L. Schuermeyer et al.; U.S. Pat. No. 3,831,155 to Tamaru et al.; and U.S. Pat. No. 3,916,390 to J. J. Chang et al. These composite cells provided memory storage for a single bit of binary information. During normal memory operation, the data was written and read from the volatile device of the composite cell. At some time during the use of the memory, such as on occurrence of a power failure, the information stored in the volatile cell was stored in the nonvolatile cell such that the information could be called back to the volatile cell at a later time.

A problem with the composite type of memory cell was that, with the requirement of more devices to comprise the cell, the memory cells became physically larger. Therefore, arrays of such composite memory cells provided a long-life memory having non-volatile storage capacity, but were relatively large in comparison to previous electronic non-volatile memories. Defining "information density" to be the number of information bits that can be stored in a unit area, the composite memory cells had relatively low information density in comparison to previous electronic non-volatile memories. Accordingly, there was a need in the prior art for an electronic memory that not only had non-volatile storage capability and a long life expectancy, but also had high information density.

A somewhat related problem in the prior art is the speed at which information can be stored into and retrieved from a memory cell. For example, the memory of a typical computer system is usually organized in a hierarchial fashion to achieve required capacity and performance at an acceptable cost. The memory includes a primary memory that is randomly word addressable, provides fast data access, and is relatively expensive; together with secondary and higher order memories that are generally addressable in a different fashion, and usually provide non-volatile storage. The higher memory levels have progressively larger capacity, slower access and lower cost. At each memory level, the hierarchy design of computer memories involves tradeoffs in terms of access time, capacity and cost.

In view of the hierarachial organization of computer memories, a known method of facilitating computer processing has been to partition the data and the computer program into fixed groups of words called a "page". Pages that contain data and program necessary for immediate processing are stored in the primary memory. When the computer cannot find a required item in the primary memory, a "page fault" occurs. In this event, a higher order memory is referenced to obtain the necessary page or pages, and the processing of the related program is terminated until the data or program is available in primary memory.

Computer idle time caused by delay in obtaining data from high order memory adversely affects the computer efficiency such that reduction of idle time is of major importance in both software and hardware design. Accordingly, an important development has been multiprogramming techniques in which a computer stores pages from several programs in the primary memory and jumps from program to program when input/output (I/O) is necessary, such that computing operations can be executed simultaneously with I/O operation. However, such multiprogramming techniques require considerable software expense in maintaining track of data and current operations.

The performance of a secondary and higher order memories is primarily characterized by the required time delay between reception of a request for stored information and the time when the information is available in primary memory. This time delay is comprised of access time and flow time. Access time is the delay between the reception of the request and the availability of the first data element of the information at the output of the memory. Flow time is the time required to transfer all the requested information from the memory output to the primary memory.

Accordingly, there also existed a need for memory devices and memory storage and retrival techniques having lower time delays for transferring data from high order memories to primary memory. Moreover, such devices and methods must afford the nonvolatile storage capability and also be economically competative with existing devices and methods.

SUMMARY OF THE INVENTION

In accordance with the present invention, a memory sub-array that can be used to form a larger memory includes a non-volatile memory array that cooperates with a volatile memory cell. The volatile memory cell is responsive to binary data signals to store the data in volatile condition. The non-volatile memory array, which has substantially higher storage density than the volatile memory cell, is responsive to control signals to selectively store the data in the volatile memory cell in non-volatile condition.

Preferably, the volatile memory is a static cell comprised of a flip-flop having a pair of metal-insulator-silicon (MIS) transistors with the gate and drain of one transistor respectively connected to the drain and gate of the other transistor. The non-volatile memory array is comprised of non-volatile memory cells of memory-type metal-nitride-oxide-silicon (MNOS) transistor pairs, the gates of each transistor pair being selectively responsive to a control signal and the source regions of each transistor pair being responsive to complementary binary information stored in the volatile memory cell to control the threshold voltage of the respective transistors such that the information is stored in non-volatile condition.

Other details, objects and advantages of the invention will become apparent as the following description of a presently preferred embodiment and a presently preferred method of practicing the same proceeds.

BRIEF DESCRIPTION OF THE DRAWINGS

The accompanying drawings show a presently preferred embodiment of the invention and illustrate a presently preferred method of practicing the same in which.

DESCRIPTION OF THE PREFERRED EMBODIMENT

Figure 1:
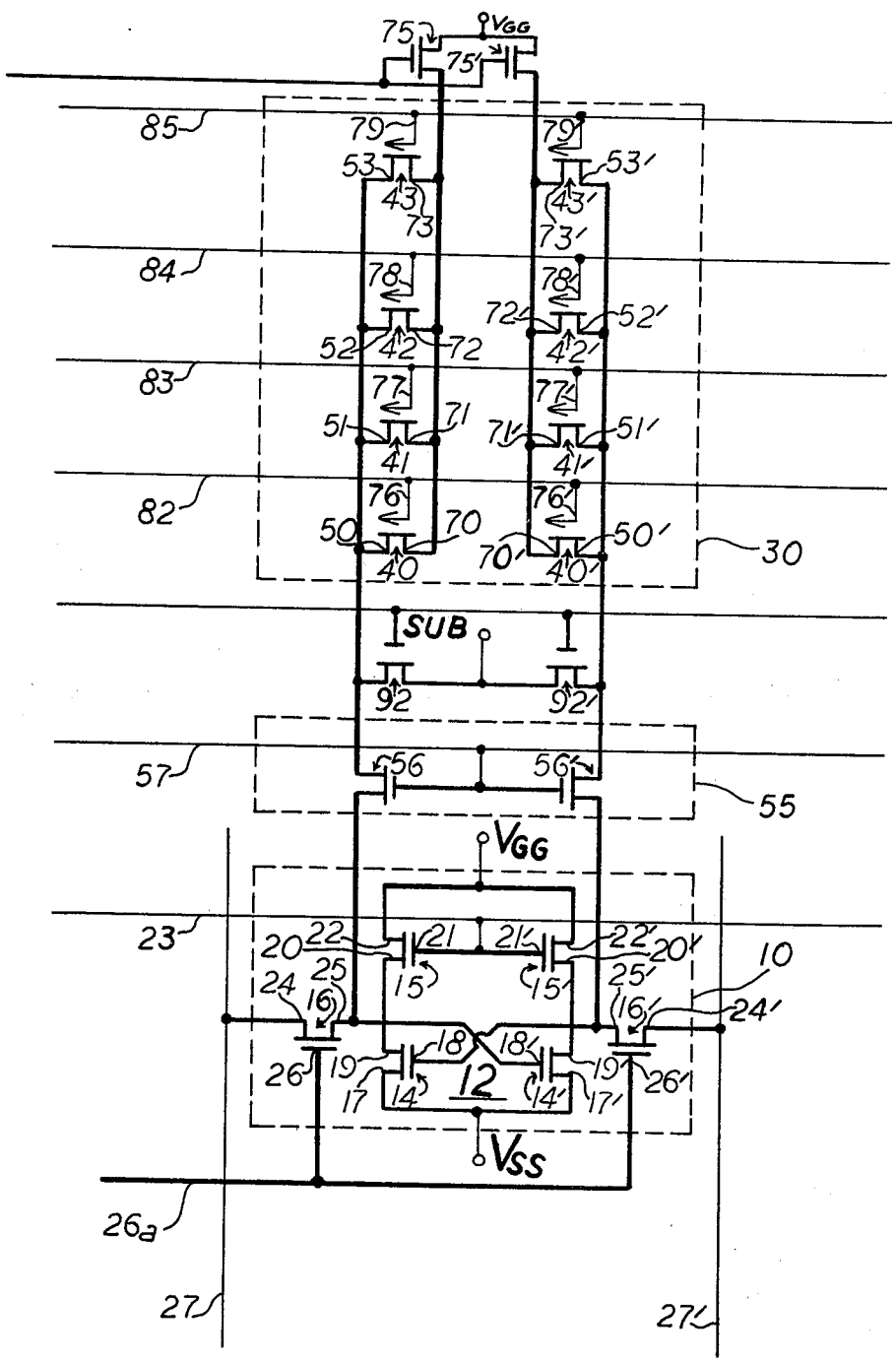
FIG. 1 is an electrical diagram that schematically shows the presently preferred embodiment.

In accordance with the memory cell shown in FIG. 1, a volatile memory cell 10 includes a flip-flop 12 comprised of transistors 14, 14', 15 and 15', and includes a pair of access transistors 16,16'. Preferably, transistors 14, 14', 15, 15', 16, and 16' are nonmemory, p-channel enhancement mode, metal-oxide-nitride-semiconductor (MNOS) transistors.

Transistors 14, 14', 15, 15' are respectively provided with source terminals 17, 17', 20, 20'; drain terminals 19, 19' 22, 22'; and gate terminals 18, 18', 21, 21'. In accordance with the diagram conventions of FIG. 1, source terminals 17, 17' are connected to supply voltage VSS. Gate terminal 18 of transistor is is connected to drain terminal 19' of transistor 14' and to source terminal 20' of transistor 15'. Gate terminal 18' of transistor 14' is connected to drain terminal 19 of transistor 14 and to source terminal 20 of transistor 15. The gate terminals 21, 21' of transistors 15, 15' are connected to a control signal line 23 and drain terminals 22, 22' are connected to supply voltage VGG.

Access transistors 16, 16' are preferrably semmetrical in operation as described in U.S. Pat. No. 3,836,894 to J. R. Cricchi. Thus terminals 24, 24' and 25, 25' may assume either the source or drain functions. Terminals 24, 24' are responsive to complementary information signals on bit lines 27, 27' respectively. Transistors 16, 16' are also provided with gate terminals 26, 26' which are connected together and are responsive to voltage signals provided on volatile memory word line 26a.

The volatile memory cell 10 cooperates with a non-volatile memory array 30 to provide the memory sub-array of the present invention. Non-volatile memory array 30 includes an array of memory type MNOS transistor pairs 40, 40'-43, 43' with each transistor pair 40, 40'-43, 43' forming a non-volatile memory cell. While the presently preferred embodiment includes four pairs of non-volatile memory transistors, it will be appreciated that the number of transistor pairs may vary with the particular application and can be less than or greater than the number presently shown and described. Also, where data is not provided in complementary fashion and only one binary signal is to be stored, the memory type transistors that comprise the cells of the non-volatile memory array need not be arranged in pairs but, rather, only individual transistors are required for each non-volatile memory cell. Preferably, transistors 40, 40'-43, 43' are of the type described in U.S. patent application Ser. No. 219,463 filed Jan. 20, 1972.

Transistors 40-43 and 40'-43' have source terminals 50-53 and 50'-53' respectively. Source terminals 50-53 are connected together and to volatile memory cell 10 at terminal 19 of transistor 14 while source terminals 50'-53' are connected together and to volatile memory cell 10 at terminal 19' of transistor 14'.

The connection of terminals 50-53 and 50'-53' to volatile cell 10 can be direct. However, it is preferred that terminals 50-53 and 50'-53' be connected through a transfer structure 55. Transfer structure 55 includes transistors 56, 56' which provide a means of selectively connecting the volatile cell 10 to the non-volatile array 30 in response to a control signal on line 57.

Transistors 40-43 and 40'-43' also have drain terminals 70-73 and 70'-73' respectively. Terminals 70-73 are connected together and to supply voltage $V_{GG}$ while terminals 70'-73' are also connected together and to supply voltage $V_{GG}$. Preferably, terminals 70-73 and 70'-73' are connected to $V_{GG}$ through transistor switches 75, 75' respectively. Transistor pairs 40, 40'-43, 43' have respective gate terminals 76, 76'-79, 79' connected together and to non-volatile memory row address lines 82-85 respectively.

Figure 2:
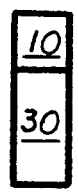
FIG. 2 is a block diagram illustrating the disclosed sub-array.

The embodiment of the memory sub-array diagramed in FIG. 1 is intended for use in a memory device that incorporates a multiple of such sub-arrays. FIG. 2 shows a block diagram of the disclosed sub-array with FIG. 3 showing how the block diagram sub-array is iterated to form a large memory array that can be operated in several modes.

Figure 3:
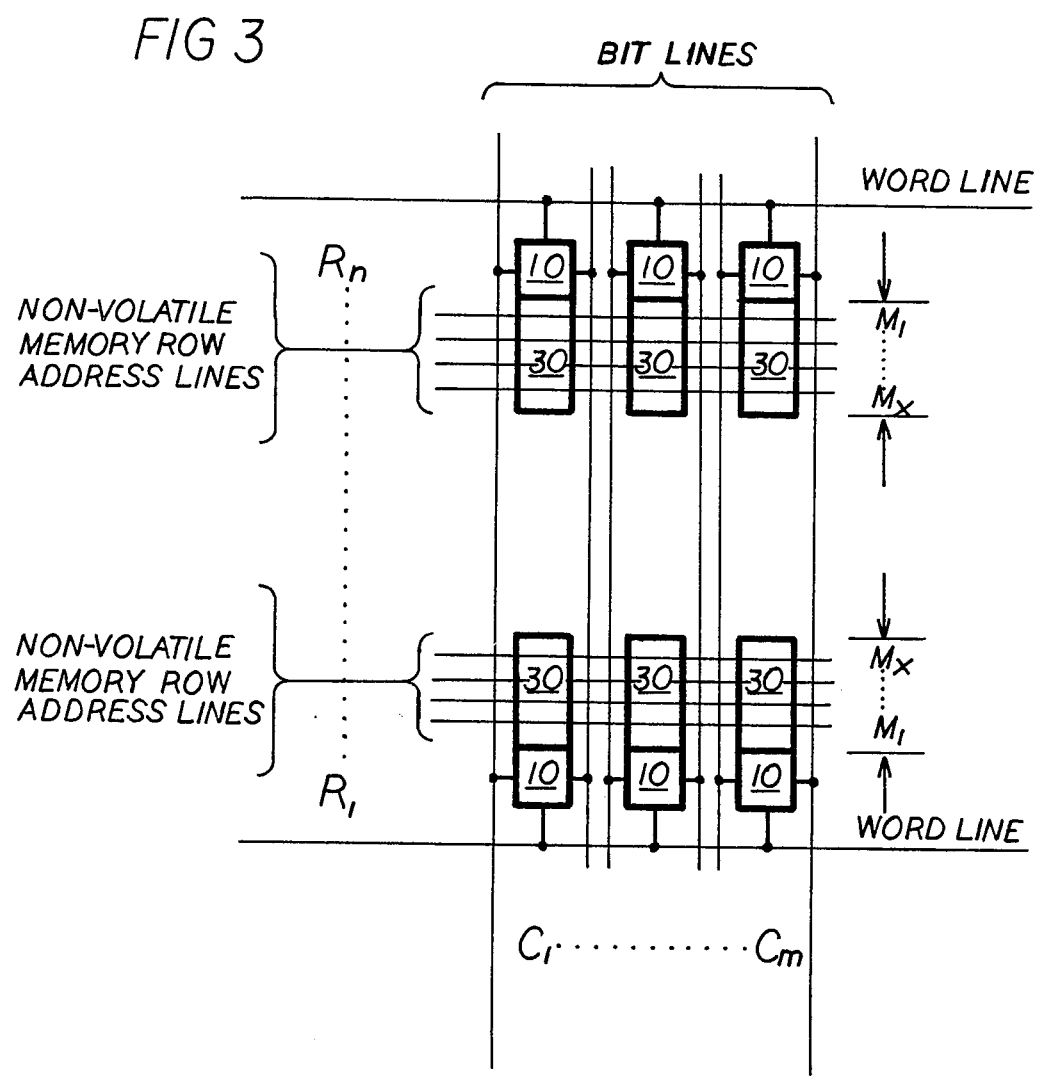
FIG. 3 is a diagram that illustrates the organization of a plurality of the sub-arrays of FIG. 2 to form a larger memory array.

When the integrated circuit is used as a volatile random access memory the volatile cells of the sub-arrays are selectively addressed by the word and bit lines shown in FIGS. 2 and 3.

The memory device can also store and read data from the non-volatile memory cells. In this case the volatile cell associated with a selected non-volatile cell will send or receive the data. By addressing the selected non-volatile cells using the row address lines shown in FIG. 2, and by applying appropriate control signals, the data contents of the non-volatile cell is written into the associated volatile cell. Also, by applying appropriate control signals, the data contents of the volatile cell can be written into an associated, addressed non-volatile cell.

The operation of the memory sub-array herein disclosed is further described in accordance with the operational modes of volatile cell 10 and non-volatile memory array 30. The volatile cell modes are store, write and read while the non-volatile array modes are store, erase, write and read. The nonvolatile array write and read modes are preformed through interaction with volatile cell 10.

As shown in FIG. 1, the volatile memory cell 10 operates as a conventional 6 transistor static memory cell well known to persons skilled in the art. The two cross coupled transistors 14, 14' serve as the data storage elements. During volatile cell operations, the control signal on the gate terminals 21, 21' of transistors 15, 15' is held at a negative voltage close to VGG. Transistors 15,15' are optional load elements and, in alternative embodiments, the non-volatile array transistors 40,40'-43/34' can serve a dual function as load elements. Transistors 16, 16' serve to selectively connect the cell 10 to the bit lines 27,27' in response to the word line signal.

To hold or store data a the volatile cell flip-flop 12 resides in one of its two stable states. Word line 26a is held positive and transistors 16, 16' are off such that the cell is isolated from bit lines 27, 27'. To write data into the cell the bit lines are connected to flip-flop 12 by applying a negative voltage to gates 26,26' of transistors 16, 16' such that transistors 16, 16' are turned on, and the complementary data signals on bit lines 27, 27' are coupled to flip-flop 12. The driving impedance from bit lines 27, 27' is sufficiently low to force flip-flop 12 into the same state as bit lines 27, 27'.

To read the contents of the volatile cell 10, one or both of bit lines 27, 27' is connected to external sensing circuitry (not shown). In this case, word line 26a is held negative and flip-flop 12 drives the bit lines 27, 27'.

Although it is possible to use one MNOS memory transistor to store binary data, the use of two transistor cells is preferred to insure high production yield and adequate retention in the presence of normal process variation. Thus a the preferred embodiment of the non-volatile portion of the disclosed sub-array is to use two transistor cells.

There are several alternative methods of operation of MNOS two transistor cells. Fundamentally, data is recognized by a differential comparison of the two memory transistor threshold voltages or of circuit parameters dependent on the threshold voltages. The definition of data states is arbitrary. For example in FIG. 1, a logical one is defined to exist in the non-volatile cell composed of transistors 42, 42' when transistor 42 is in the HC state and transistor 42' is in the LC state.

Therefore a logical zero is defined as transistor 42 in the LC state and transistor 42' in the HC state. The combination of both 42 and 42' in the HC state is called the "clear" or "erase" state. The erase state is neither a logic one or logic zero, but is an intermediate condition when the two transistor cell is being prepared to receive new data. The combination of both 42 and 42' in the LC state is logically undefined, and is not used in the preferred embodiment of the invention.

In the store mode of non-volatile memory array 30, the individual transistor pairs are in logic one or logic zero states, and the memory transistor gate to source and gate to substrate voltages are clamped to zero volts. The "memory substrate" is defined to be the silicon region. In FIG. 1, transistors 92, 92' act in response to a control signal to connect the memory transistor source terminals 50-53 and 50'-53' to the memory substrate. Other switches which are part of the nonvolatile memory row address circuitry (not shown) connect the row address lines 82-85 to the memory substrate.

Although several erase modes of operation of non-volatile cell 30 are possible in the preferred embodiment only one row of non-volatile memory cells is to be erased. Erase is accomplished by applying a positive gate-to-memory substrate voltage on the selected row while maintaining zero gate-to-memory substrate voltages on nonselected rows. For example, transistors 42 and 42' can be erased by applying +25 volts relative to the memory substrate on line 84. However, this approach has the disadvantage of requiring both positive and negative voltage pulses to operate the integrated circuit.

The preferred means of erasing the non-volatile row is to pulse the memory substrate negative. Specifically the memory substrate and all unaddressed row lines are pulsed negative while the addressed row line is held positive. When, in FIG. 1, the memory substrate is normally held at the potential of the supply voltage VSS, transistors 42 and 42' are erased by connecting the row line 84 to the supply voltage VSS by the row address circuitry. (not shown). The row address circuitry also connects row lines 82, 83, and 85 to the memory substrate. A separate circuit then drives the memory substrate to approximately 25 volts more negative than VSS.

When this technique for erase is employed a the volatile cell 10 should be isolated from the non-volatile array 30 by opening transfer structure 55. If the subarray is fabricated on bulk silicon, the volatile cell and the integrated circuit control circuitry should be isolated from the memory substrate by reverse biased PN junctions.

To write data into a nonvolatile cell, one of the two memory transistors in the cell must receive a negative gate to source voltage pulse while all other memory transistors are not disturbed. Accordingly, the volatile cell 10 is connected to the source lines of the non-volatile array 30 and selected non-volatile cell is addressed. As a specific example, consider the method for writing a logic one into the nonvolatile cell formed by transistors 42 and 42'. A logical one is defined to mean that transistor 42 is in the HC state, and transistor 42' is in the LS state.

Prior to being written, transistors 42 and 42' have both been forced to the HC state by an erase operation. The volatile memory cell contains the data to be written. Transistor 14 is off, and the voltage at the drain terminal 19 is pulled negative toward VGG through transistor 15. Transistor 14' is on, and the voltage at the drain terminal 19' is held at VSS. When transistors 56, 56; are turned on by a negative signal at line 82 a the source terminals of the non-volatile array are connected to the drain terminals 19, 19', and are forced to a negative voltage approaching VGG and VSS respectively. The row address lines 82-85 are at VSS. To cause transistor 42' to shift into the LC state, line 84 is pulsed negative. This results in a negative voltage from terminal 62'·to terminal 72' which is the proper condition for writing. The relative potentials on other transistors in the non-volatile array prevent those devices from writing.

The process of reading data from the non-volatile array involves using the volatile memory cell flip-flop as a sense amplifier. The initial conditions for reading include holding the row address lines 82-85 at VSS, holding the word line 26 at Vss, disabling load element transistors 15, 15' by holding the control signal on gate terminals 21, 21' positive, enabling the transfer gate transistors 81, 81' by holding line 82 negative, and forcing the memory transistor source lines and the volatile cell flip-flop nodes 19, 19' to VSS by holding transistors 92, 92' on with a negative control signal on the gate terminals. To read out the cell composed of transistors 42, 42', control signals are applied to the sub-array turning on transistors 75, 75' and turning off transistors 56, 56'. The row address line 72 is then pulled negative. Assuming that transistor 42 was in the HC state, and transistor 42' was in the LC state, as line 72 becomes more negative, transistor 42 will begin to conduct before transistor 42'. The drain-to-source current from transistor 42 will be larger than the drain-to-source current from transistor 42', and will charge up the capacitance associated with the gate terminal 18' of transistor 14'. When the gate voltage is sufficiently negative, transistor 14' will turn on, and because of the cross couple connection of drain 19' to gate 18, transistor 14 will be held in the off state. At this time the data has been transferred to the volatile cell. The load elements 15, 15' may be turned on, and the non-volatile array may be disconnected from the volatile cell and be returned to the storage mode.

One particularly important aspect of the present invention is that non-volatile memory array 30 is comprised of a plurality of non-volatile memory elements 40,40'-43,43'. Accordingly, a series of data values can be sequentially stored by separately storing the data in volatile condition in flip-flop 12, and then storing the data in non-volatile condition in a selected element of non-volatile memory array 30. The data can then be retrieved in any selected sequence by addressing the desired non-volatile memory cell, and by reading the data into the associated volatile memory cell.

The association of a plurality of non-volatile memory elements 40,40'-43,43' with a single volatile memory element therefore provides an additional dimension of memory in comparison to memory elements of the prior art. This distinction is further explained in relation to FIG. 3.

FIG. 3 illustrates the association between the volatile memory cells 10, and an array of non-volatile memory cells. The volatile memory cells 10 are arranged in a two dimensional array of m columns ($C_1 \ldots C_m$) and n rows ($R_1 \ldots R_n$), and, in addition, have associated therewith x number of non-volatile memory levels ($M_1 \ldots M_x$). That is, in accordance with the foregoing description, each volatile memory cell 10 is associated with an array of x number of non-volatile memory cells 40,40'-43,43' in FIG. 1. Therefore, a single volatile memory cell communicates with an array of non-volatile memory cells in accordance with the present invention.

Advantages of the disclosed memory sub-array include a greater memory density per unit area. That is, associating a plurality of non-volatile memory elements with a single volatile element provides larger memory capacity per unit area than was previously available. For example, consider a memory sub-array having a volatile memory cell 10 as disclosed but having a non-volatile memory array 30 that includes only a single non-volatile memory cell. Let the area required for this memory sub-array be unity (1) with eighty percent of the area being occupied by the volatile memory cell 10 and twenty percent of the area occupied by the non-volatile memory cell. To provide additional memory capacity in accordance with this memory sub-array having a single non-volatile cell, the physical size of the memory would increase in direct proportion to the increase in memory sub-arrays. That is, two memory sub-arrays would require two area units, three memory sub-arrays would require three area units, and so forth.

However, in accordance with the disclosed memory sub-array, the increase in non-volatile memory cells is disproportionately greater than the increase in physical size of the memory sub-array. For example, when the volatile memory cell requires 0.8 unit area and each non-volatile memory cell in the non-volatile memory array 30 requires 0.2 unit area, a memory sub-array in accordance with the presently disclosed inventions having two cells in non-volatile memory array 30 requires only 1.2 area units, and a memory sub-array having three in non-volatile memory array 30 requires only 1.4 area units. In terms of the density of non-volatile memory cells per unit area, the density of the disclosed memory cells is 1.67 for two non-volatile memory cells, 2.15 for three non-volatile cells and 2.50 for four non-volatile cells. Generally, this density can be expressed by the relation $$n/0.8+0.2n$$

where n is the number of non-volatile cells.

Another advantage of the disclosed sub-array is that it is suitable for application in a computer primary memory without being limited by erase-write cycle limitations. A cell in a random access primary memory could potentially accumulate $10^{12}$ write cycles in less than one week of operation. The volatile memory cell in the disclosed sub-array is not affected by accumulated write cycles. It is expected that the need to write data into the nonvolatile portion of the sub-array occurs at a much lower rate similar to that experienced in secondary memory. Thus, nonvolatile memory cell erase-write cycle accumulation on the order of $2\times10^7$ cycles is expected over about 10 years of operation. This level of endurance is compatible with the characteristics of MNOS transistors equipped with stress protection features.

Another advantage of the invention is that it allows the construction of integrated circuit memory devices which combine the functions of primary and secondary storage with a significant reduction in the time required to bring data into primary memory. Prior art secondary storage such as magnetic discs or drums require tens of milliseconds to access the first word in a data block. Additional time, called flow time, on the order of a millisecond is required to electronically transfer the individual words over communication lines into the primary memory. The disclosed sub-array will allow the reduction of access time to a few microseconds, and will completely eliminate flow time. This is a reduction of about 1000 times in the delay time for data transfer from secondary to primary storage.

While a presently preferred embodiment of the invention has been shown and described, and a preferred method of practicing the same has been illustrated, it is to be understood that the invention is not limited thereto, but may be otherwise variously embodied within the scope of the following claims.

I claim:

1. A composite memory array for storing binary words in a volatile state in response to control signals on complementary bit lines and word lines and for selectively storing binary words in a non-volatile state in response to control signals on row lines, said composite memory array comprising:
   a pair of access transistors that are respectively connected to the complementary bit lines and that are connected to a word line;
   a flip-flop circuit connected to the access transistors for storing binary data signals from the complementary bit lines in a volatile state in response to control signals provided to the word lines; and
   an array of non-volatile memory cells connected to the flip-flot circuit and to a plurality of row lines, said non-volatile array storing binary data signals from the flip-flop circuit at a selected non-volatile memory level in response to control signals selectively provided to the row lines.

2. The composite memory array of claim 1 wherein the non-volatile memory cells of said array include pairs of non-volatile devices that store complementary binary data from the flip-flop circuit.

3. The composite memory array of claim 2 wherein the non-volatile memory devices are comprised of metal-nitride-oxide-silicon transistors.

4. A composite memory array for storing binary words in a volatile state in response to control signals on complementary bit lines and on word lines and for selectively storing binary words in a non-volatile state in response to control signals on row lines, said composite memory array comprising:
   a pair of access transistors that are respectively connected to the complementary bit lines and that are connected to a word line;
   a flip-flop transistor pair connected to the access transistors, said flip-flop transistor pair providing gate voltages for storing binary data signals from the complementary bit lines in a volatile state in response to control signals provided to the word lines;
   an array of memory-type transistor pairs, the gates of each memory-type transistor pair being connected to a selected row line and one of the source or drain of each memory-type transistor being connected to a gate of the flip-flop transistor pair, said array of memory-type transistor pairs storing gate voltages of the flip-flop transistors in a selected memory-type transistor pair in response to control signals selectively provided to the row lines.

5. The composite memory array of claim 4 further comprising:
   a transfer structure for selectively connecting the flip-flop transistor pair to the array of memory-type transistors such that the flip-flop transistors can be disconnected from the array when erasing the memory-type transistors.

6. The composite memory array of claim 5 further comprising:
   means for erasing the data stored in a selected memory-type transistor pair of the non-volatile memory array by providing a voltage signal to said transistor pair having the same polarity as the control signal provided on the respective row line.

7. The composite memory array of claim 4 wherein the source region of each transistor pair is connected to a gate of the flip-flop transistor pair such that the memory-type transistor pairs store the gate voltages of the flip-flop transistor pair in accordance with the threshold voltage of the respective memory-type transistors.

8. The composite memory array of claim 7 wherein said array of memory-type transistor pairs is comprised of metal-nitride-oxide-silicon transistor pairs.

* * * * *